United States Patent
Noguchi et al.

[11] Patent Number: 5,817,548
[45] Date of Patent: Oct. 6, 1998

[54] METHOD FOR FABRICATING THIN FILM TRANSISTOR DEVICE

[75] Inventors: Takashi Noguchi; Yasushi Shimogaichi, both of Kanagawa, Japan

[73] Assignee: Sony Corporation, Tokyo, Japan

[21] Appl. No.: 745,284

[22] Filed: Nov. 8, 1996

[30] Foreign Application Priority Data

Nov. 10, 1995 [JP] Japan ................................. 7-317431
Dec. 15, 1995 [JP] Japan ................................. 7-348096

[51] Int. Cl.$^6$ ............................................... H01L 21/268
[52] U.S. Cl. ........................... 438/160; 438/166; 438/308; 438/487; 148/DIG. 91; 117/8; 117/904
[58] Field of Search ................. 437/19, 21, 40 TFT, 437/40 TFI, 41 TFT, 41 TFI, 173, 174, 907, 908; 117/7–10, 43, 904; 148/DIG. 90–DIG. 93; 438/160, 166, 308, 487

[56] References Cited

U.S. PATENT DOCUMENTS

| | | | |
|---|---|---|---|
| 5,219,786 | 6/1993 | Noguchi | 437/174 |
| 5,306,651 | 4/1994 | Masumo et al. | 437/40 TFT |
| 5,432,122 | 7/1995 | Chae | 437/173 |
| 5,477,073 | 12/1995 | Wakai et al. | 257/347 |
| 5,589,406 | 12/1996 | Kato et al. | 437/174 |
| 5,612,251 | 3/1997 | Lee | 437/173 |

FOREIGN PATENT DOCUMENTS

| | | | |
|---|---|---|---|
| 59-5624 | 1/1984 | Japan . | |
| 60-245124 | 12/1985 | Japan | 148/DIG. 90 |
| 61-63019 | 4/1986 | Japan | 437/173 |
| 62-98774 | 5/1987 | Japan | 437/174 |
| 63-102265 | 5/1988 | Japan | 437/41 TFT |

OTHER PUBLICATIONS

Noguchi et al, "Enlargement of P–Si Film Grain Size by Excimer Laser Annealing and Its Application to High–Performance P–Si TFT", *Extended Abstracts of the 1991 International Conference on Solid State Devices and Materials*, Yokohama, 1991, pp. 623–625.

T. Nishimura et al., Jpn. J. Appl. Phys. 22(1983) Suppl. 22–1. pp. 217–221 "Evaluation and control of grain boundaries in laser recrystallized polysilicon islands . . . ".

Primary Examiner—Charles L. Bowers, Jr.
Assistant Examiner—Leon Radomsky
Attorney, Agent, or Firm—Hill & Simpson

[57] ABSTRACT

A method for crystallizing a portion of a semiconductor thin film while forming a semiconductor device comprises providing a transparent substrate supporting a metallic gate electrode and an amorphous semiconductor thin film which are separated from each other by a gate insulating film, heating the gate electrode by subjecting it to light rays, and applying a laser beam to the amorphous semiconductor thin film so that the portion of the semiconductor thin film adjacent the metallic gate electrode is heated by both the laser beam and the heat of the gate electrode to cause a crystallization of a portion of the amorphous thin film and then processing the remaining amorphous portions of the thin film to form the transistor structure.

10 Claims, 8 Drawing Sheets

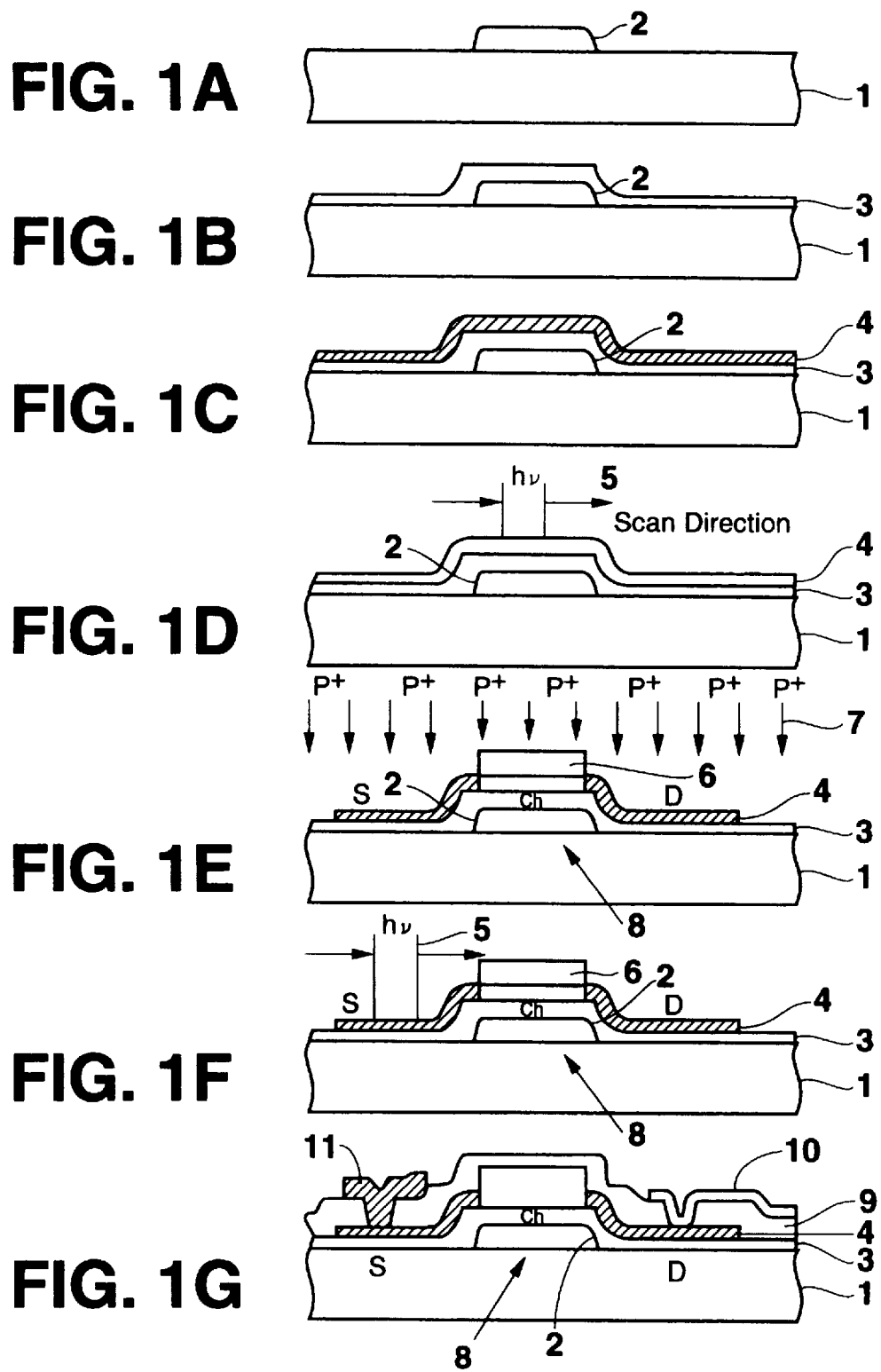

SCAN DIRECTION

GATE DIRECTION
CHANNEL DIRECTION
SCAN DIRECTION

ORTHOGONAL SCAN

CHANNEL DIRECTION
GATE DIRECTION
SCAN DIRECTION (PARALLEL SCAN)

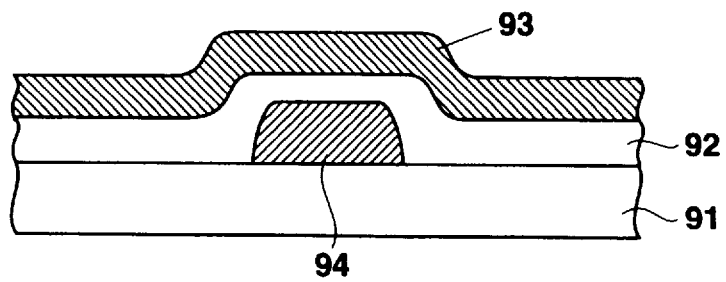
FIG. 9A
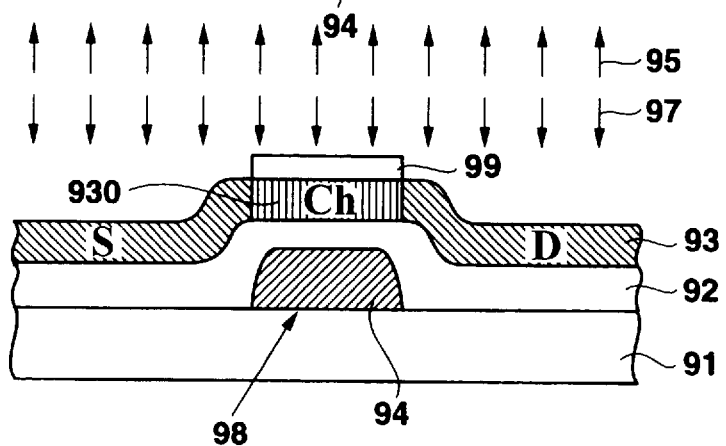
FIG. 9B
FIG. 9C
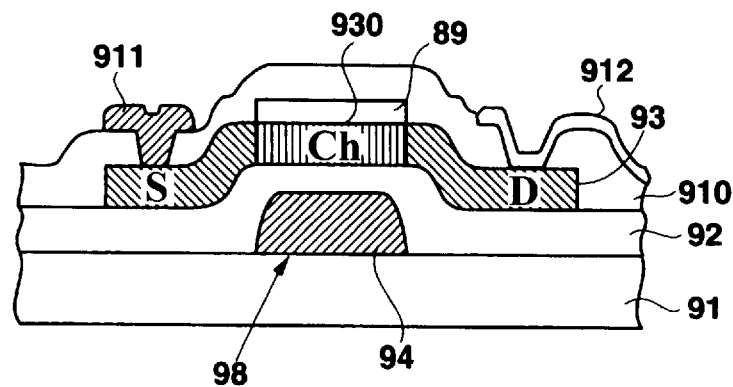
FIG. 9D

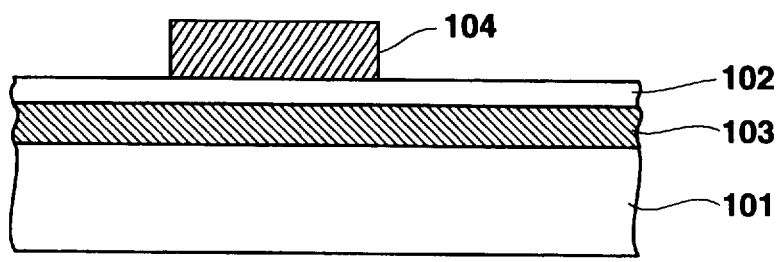
FIG. 10A
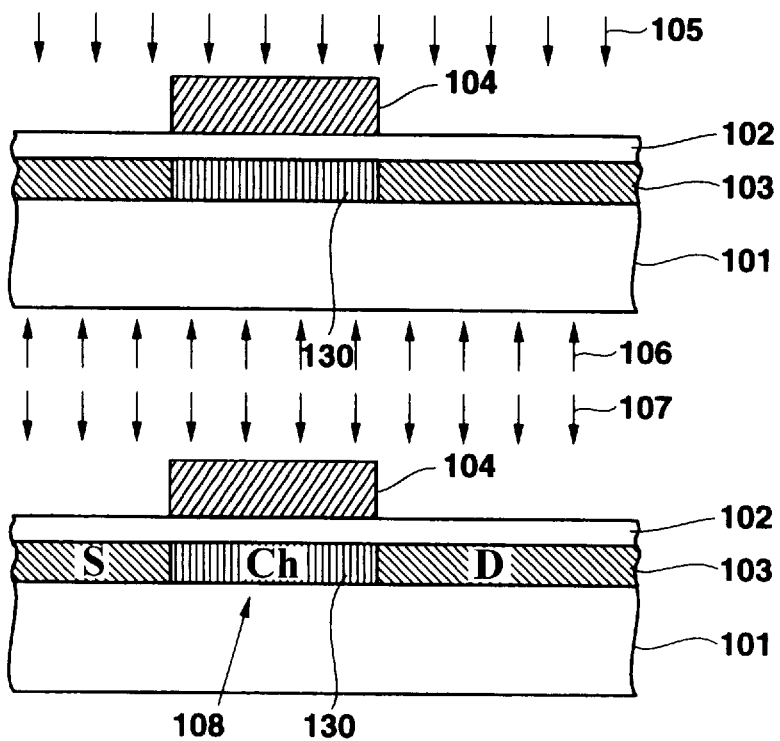
FIG. 10B
FIG. 10C
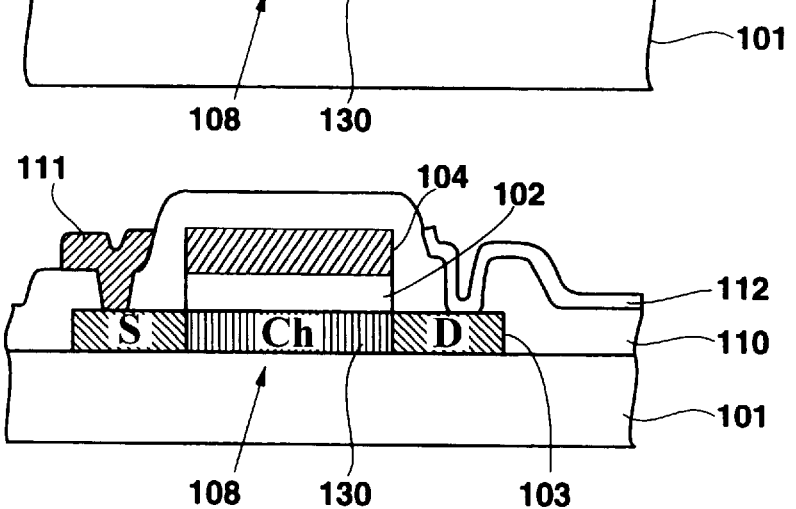
FIG. 10D

METHOD FOR FABRICATING THIN FILM TRANSISTOR DEVICE

BACKGROUND OF THE INVENTION

The present invention relates to a method for fabricating a thin film semiconductor device in which a thin film transistor having an active layer of a semiconductor thin film formed on an insulating substrate is integrally formed and more particularly to a laser annealing technology for implementing a crystallization of the semiconductor thin film after forming it on the insulating substrate.

As a part of a method for lowering the processing temperature of manufacturing steps of a thin film semiconductor device, a crystallization annealing technology using a laser beam is being developed. It enables a crystallization of a semiconductor thin film in a cooling step after applying an energy beam (laser beam) to locally heat the non-monocrystalline semiconductor thin film such as amorphous silicon or polycrystalline silicon formed on a transparent substrate. A thin film transistor is integrally formed utilizing the crystallized semiconductor thin film as an active layer (channel region) thereof.

A thin film semiconductor device is suited as a driving substrate and the like of an active matrix type display panel and is being actively developed in recent years. Then, while it has been strongly requested to increase the size and the lower the cost of the transparent substrate in applying it to the display panel, the above-mentioned crystallization annealing using the laser beam is drawing attention as a method that meets this request. Because the semiconductor thin film may be crystallized at relatively low temperature by applying a laser beam, a relatively low cost transparent substrate such as low fusion point glass may be adopted. In this case, a technology of preliminarily heating the insulating substrate by using a heater or the like to assist the crystallization annealing using the laser beam has been proposed and is described in Extended Abstracts of the 1991 International Conference on Solid State Devices and Materials, Yokohama, 1991, pp. 623–625, for example.

Generally, it is necessary to raise the temperature to 600° C. or more to crystallize amorphous silicon. Accordingly, if the substrate is heated preliminarily to raise the substrate temperature up to around 400° C. beforehand, energy density of the laser beam may be saved that much and it works favorably on the crystallinity and uniformity of the semiconductor thin film. The semiconductor thin film having a large grain size and an excellent crystallinity may be obtained by carrying out the crystallization annealing together with the preliminary heating of the substrate. It has been known that the thin film transistor formed by this film is highly efficient as it has a high carrier mobility and an excellent gate voltage swinging characteristic. However, there has been a problem concerning the throughput in the preliminary heating method using the heater because it took a considerable time to raise the temperature of the transparent substrate to a predetermined temperature. For example, it took several minutes to ten-odd minutes of preliminary heating time to raise the temperature of the transparent substrate made from normal glass or the like to 400° C.

Instead of the substrate preliminary heating (furnace annealing) using the heater (electric furnace), a so-called lamp annealing for preliminarily heating the substrate by applying illuminant light from a lamp in a batch has been also proposed. While a halogen lamp containing a large amount of heat rays such as infrared rays is used in the lamp annealing in general, it is inefficient and is not practical because the semiconductor thin film formed on the transparent substrate such as glass barely absorbs infrared rays and its temperature does not rise, though it can effectively heat a silicon wafer used in fabricating normal ICs.

Meanwhile, the laser beam which is generally linear along the scan direction is applied pulse-wide intermittently while partially overlapping each other in the above-mentioned laser irradiation step. The semiconductor thin film may be crystallized relatively uniformly by overlapping the laser beams.

In applying the laser beams by partially overlapping each other in the laser annealing, a desirable distribution of sectional intensity of energy of the laser beam is as flat possible. However, in reality the intensity is weak at the peripheral portion of the laser beam as compared to that at the middle portion. If the laser beams are applied by overlapping each other in such a state, regions of non-uniformly crystallization emerge like strips in the region between the shots of the laser beams and where the edge of the laser beam is applied. A crystal grain size is generally small in this strip part of non-uniformly crystallization. Therefore, if a thin film transistor is formed by using the strip part as its channel region, it turns out to be a low performance transistor because of the small crystal grain size. Accordingly, when a plurality of thin film transistors are integrally formed on an insulating substrate, operating characteristics vary among each individual thin film transistor because the non-uniformly crystallized strip part exists. Further, there has been a problem in the reliability of the thin film transistor because its mobility is low and it deteriorates readily. If the insulating substrate on which such thin film transistor is integrally formed is used as a driving substrate of an active matrix type display unit for example, it would cause a problem in the uniformity of the image quality.

SUMMARY OF THE INVENTION

Accordingly, it is an object of the present invention to solve the aforementioned prior art problems by taking the following measures. That is, an inventive method for fabricating a thin film semiconductor device comprises, basically, a film forming step and an irradiation step. In the film forming step, a semiconductor thin film is formed on an insulating substrate. In the irradiation step, an energy beam having a linear irradiation area is applied to the insulating substrate while relatively moving along a scan direction which is orthogonal to the irradiation area to crystallize the semiconductor thin film. The thin film semiconductor device is fabricated by integrally forming a thin film transistor having a channel region of the crystallized semiconductor thin film and a gate electrode which intersects that. Specifically, it is noted that the energy beam is moved in the scan direction parallel with the channel region and orthogonal to the gate electrode in the irradiation step.

According to one mode of the present invention, the energy beam is applied to the semiconductor thin film which becomes the channel region of the thin film transistor for driving a pixel electrode formed on the insulating substrate in the irradiation step.

According to another mode, the energy beam is applied to the semiconductor thin film which becomes the channel region of a thin film transistor having a bottom gate structure in the irradiation step.

According to a still other mode, the energy beam is applied to the semiconductor thin film which becomes the channel region of an N-channel type thin film transistor in the irradiation step.

When the linear energy beam is applied pulse-wise intermittently along the scan direction while partly overlapping each other, there are two kinds of relationships which can be selected among the scan direction and the direction of the gate electrode (gate direction) in general. That is, there is a case when the energy beam is moved in the scan direction orthogonal to the gate direction (orthogonal scan) and a case when the energy beam is moved in the scan direction parallel to the gate direction (parallel scan). The present invention adopts the former orthogonal scan method. In the orthogonal scan, the scan direction of the energy beam is parallel with the direction of current flowing in the channel region (channel direction). On the other hand, the scan direction of the energy beam is orthogonal to the channel direction in the parallel scan. It has been found that the former is superior as compared to the latter by evaluating electric characteristics of samples of the thin film transistors actually created by the orthogonal scan method and the parallel scan method.

A method for fabricating a thin film semiconductor device having an excellent crystallinity and a large grain size with a good throughput comprises the following steps according to one embodiment of the present invention. At first, a film forming step is carried out by forming a basic structure of a thin film transistor composed of an amorphous semiconductor thin film and a metallic gate electrode laminated on the opposite side from each other via a gate insulating film on a transparent substrate. Next, a heating step is carried out by applying heat rays from the side of the gate electrode and by causing the metallic gate electrode to absorb the rays to heat in auxiliary a region of the semiconductor thin film which is opposed to the gate electrode via the gate insulating film. Then, a crystallization step is carried out in the same time with this heating step by applying an energy beam from the side of the semiconductor thin film on the opposite side from the gate electrode to transform the semiconductor thin film in the region heated in auxiliary from the amorphous substance to a polycrystalline substance to form an active layer of the thin film transistor. Finally, an impurity injecting step is carried out by injecting impurities into part of the semiconductor thin film adjoining the active layer to form a source region and a drain region of the thin film transistor.

In concrete, the basic structure of the bottom gate type thin film transistor is formed by laminating, in order from the bottom, the gate electrode, the gate insulating film and the semiconductor thin film on the surface of the transparent substrate in the film forming step; the heat rays are applied from the back of the transparent substrate, i.e. from the side of the gate electrode, in the heating step; and the energy beam is applied from the surface of the transparent substrate, i.e. from the side of the semiconductor thin film, in the crystallization step.

Or, the thin film transistor having a top gate structure is formed by laminating, in order from the bottom, the semiconductor thin film, the gate insulating film and the gate electrode on the surface of the transparent substrate in the film forming step; the heat rays are applied from the surface of the transparent substrate, i.e. from the side of the gate electrode, in the heating step; and the energy beam is applied from the back of the transparent substrate, i.e. from the side of the semiconductor thin film, in the crystallization step.

Preferably, the gate insulating film is formed in a thickness of less than 700 nm in the forming step. Further, impurity ions are accelerated by means of an electric field to be injected into the part of the semiconductor thin film which is to be kept amorphous in the impurity injecting step. In an example of application, a wiring step is carried out by patterning a signal electrode which is connected with the source region and a pixel electrode which is connected with the drain region on the interlayer insulating film after coating the thin film transistor by it.

According to the embodiment of the present invention, the thin film semiconductor device is heated in auxiliary from the side of the metallic gate electrode which effectively absorbs heat rays by using a halogen lamp or the like. The metallic gate electrode effectively absorbs light of the lamp such as infrared rays which are one of the heat rays and the temperature of the gate insulating film right above that rises intensively and locally. This heat is immediately conducted to the semiconductor thin film and raises the temperature of the semiconductor thin film up to 400° C. to 600° C. in a short time. It is noted that because solid phase crystallization starts when the temperature exceeds 600° C., the auxiliary heating temperature is preferred to be lower than that and to be around 400° C. Thereby, it becomes possible to carry out the auxiliary heating by means of the lamp which has been impossible or been extremely difficult to implement for semiconductor thin films composed of silicon and the like in the past, and thus improves the throughput (processing time). A uniform polycrystalline semiconductor thin film having an excellent crystallinity and a large grain size may be obtained by carrying out the crystallization annealing by applying the energy beam such as the laser beam in conjunction with the auxiliary heating. A thin film transistor formed by having the semiconductor thin film as an active layer has such excellent characteristics that the carrier mobility is high and the swing characteristic is small (i.e. the threshold characteristic is low). The crystallization annealing using the auxiliary heating allows the thin film transistor to be integrated and formed on the transparent substrate made from a low fusion point glass or the like having a large area. This thin film transistor is highly efficient and is applicable to a driving substrate of an active matrix type liquid crystal display panel. The thin film transistor may be used not only for a switching element of a pixel electrode, but also for a device composing a peripheral driving circuit.

The specific nature of the invention, as well as other objects, uses and advantages thereof, will clearly appear from the description and from the accompanying drawings.

BRIEF DESCRIPTION OF DRAWINGS

FIGS. 1A through 1G are flow diagrams showing a preferred embodiment of a method for fabricating a thin film semiconductor device according to the present invention;

FIGS. 9A through 9D are flow diagrams showing another preferred embodiment of a method for fabricating a thin film semiconductor device according to the present invention;

FIGS. 10A through 10D are flow diagrams showing a still other preferred embodiment of a method for fabricating a thin film semiconductor device according to the present invention.

DESCRIPTION OF THE PREFERRED EMBODIMENTS

Figure 2A:
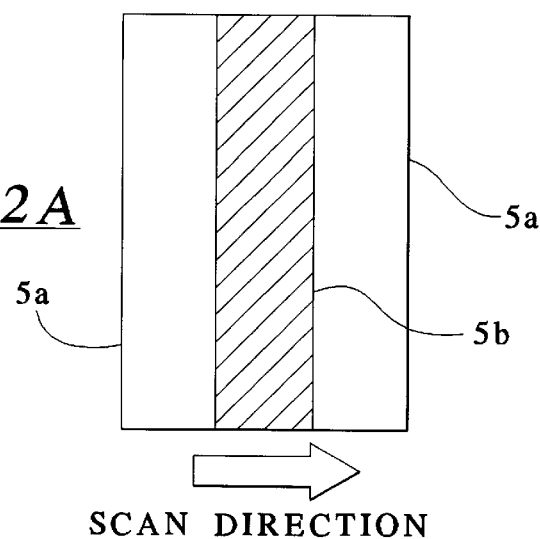
FIGS. 2A through 2C are diagrammatic views showing an orthogonal scan method and a parallel scan method of an energy beam.

The best mode for carrying out the present invention will be explained in detail below with reference to the drawings. FIGS. 1A through 1G are flow diagrams showing a method for fabricating a thin film semiconductor device according to the present invention. At first, a gate electrode 2 is formed by patterning on an insulating substrate 1 made from glass or the like in Step A. The gate electrode 2 is created by forming Mo/Ta for example on the whole surface of the substrate by sputtering or the like and then by patterning it into a predetermined shape. As a metal of the gate electrode 2, Al and Cr may be used instead of Mo/Ta.

Next, a gate insulating film 3 is formed so as to cover the gate electrode 2 in Step B. The gate insulating film 3 is formed by depositing $SiN_x$ in a thickness of 50 nm by plasma CVD for example. Or, the gate insulating film 3 may be formed by depositing $SiO_2$ in a thickness of 100 nm by plasma CVD. Further, the gate insulating film may be formed by laminating $SiN_x$ and $SiO_2$.

In Step C, a semiconductor thin film 4 which becomes an element region of a thin film transistor is formed on the gate insulating film 3. In the present embodiment, amorphous silicon is formed successively on the gate insulating film 3 by using plasma CVD. Its thickness is 30 nm for example.

After that, an energy beam 5 having a linear irradiation area is applied to the insulating substrate 1 while moving relatively along the scan direction which is orthogonal to the irradiation area to crystallize the semiconductor thin film 4 in Step D. In the example shown in the figure, the energy beam 5 is shaped linearly along the direction vertical to the surface of this page and the scan direction is parallel with the page because it is orthogonal to the energy beam 5. It is noted that a width of the energy beam 5 linearly shaped is exaggerated to be extremely narrow in the figure in order to facilitate the understanding of the present invention. Specifically, the energy beam 5 is scanned so as to cross the gate electrode 2 in the present invention. That is, the scan direction is parallel with the channel region and is orthogonal to the gate electrode 2. In the present embodiment, XeCl excimer laser beam having a wavelength of 308 nm is shaped linearly and applied as the energy beam 5. This laser beam is applied pulse-wise repeatedly at high speed. The laser beam is shaped into a line of 300 nm×0.5 nm for example and its irradiation energy density is set at 350 $mJ/cm^2$. The pulse width of the laser beam is about 40 nsec. For example and is applied pulse-wise with a repetitive frequency of about 150 Hz. At this time, the linear laser beam is applied pulse-wise by overlapping each other by about 20%. It is noted that the irradiation conditions described above are mere examples and will not limit the scope of the present invention.

In Step E, a relatively thick insulating film is deposited on the semiconductor thin film 4. In the present embodiment, $SiO_2$ is deposited in a thickness of 100 to 200 nm by means of plasma CVD. A photoresist is applied on this insulating film. Then, the photoresist is patterned by carrying out an exposure process from the back by using the gate electrode 2 which is made from metal or the like and which shields light as a mask. The insulating film is wet-etched via the patterned photoresist to form a mask (channel stopper) 6.

That is, the mask 6 is patterned in accordance to the shape of the gate electrode 2 by utilizing the back exposure. Ion doping is then carried out in this state. That is, ion shower 7 containing impurity ions (e.g. $P^+$) is accelerated by an electric field to be applied to the semiconductor thin film 4 via the mask 6 to form a source region S and a drain region D. As a result, a bottom gate type thin film transistor 8 may be formed. Further, a channel region Ch is left right under the mask 6. As it is readily understood by making reference to Steps D and E, the scan direction of the energy beam 5 is parallel with the direction of current flowing in the channel region Ch (channel direction). On the other hand, the gate electrode 2 intersects the channel region Ch and the scan direction of the energy beam 5 is orthogonal to the gate direction. That is, the present invention adopts the orthogonal scan method.

In Step F, the energy beam 5 is applied again to the semiconductor thin film 4 to activate the injected impurities. Thereby, the resistance of the source region S and the drain region D of the thin film transistor 8 can be lowered.

Finally in Step G, the thin film transistor 8 is coated by an interlayer insulating film 9 made from PSG or the like. Contact holes are opened through the interlayer insulating film 9 by wet-etching. Then, a transparent conductive film such as ITO is formed on the interlayer insulating film 9 and is patterned into a predetermined shape to create a pixel electrode 10. As a result, the pixel electrode 10 is electrically connected with the drain region D of the thin film transistor 8 via the contact hole. Further, a metal film such as aluminum is formed on the interlayer insulating film 9 by means of sputtering and is patterned into a predetermined shape to create a wiring electrode 11. This wiring electrode 11 is also electrically connected with the source region S of the thin film transistor 8 via the contact hole opened through the interlayer insulating film 9. The fabrication of the thin film semiconductor device suited for the driving substrate of the active matrix type display unit is thus completed. Specifically, the energy beam 5 is applied to the semiconductor thin film 4 which becomes the channel region of the thin film transistor 8 for driving the pixel electrode 10 formed on the insulating substrate 1 in the present embodiment. It is noted that the inventive orthogonal scan method may be applied also to a thin film transistor which composes a peripheral driving circuit by applying the energy beam in the same time to crystallize the semiconductor thin film.

Figure 2B:
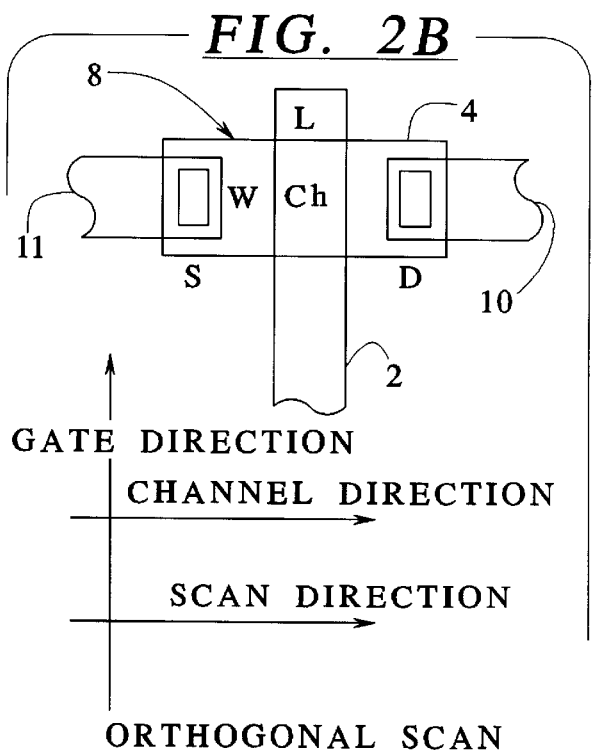
Figure 2C:
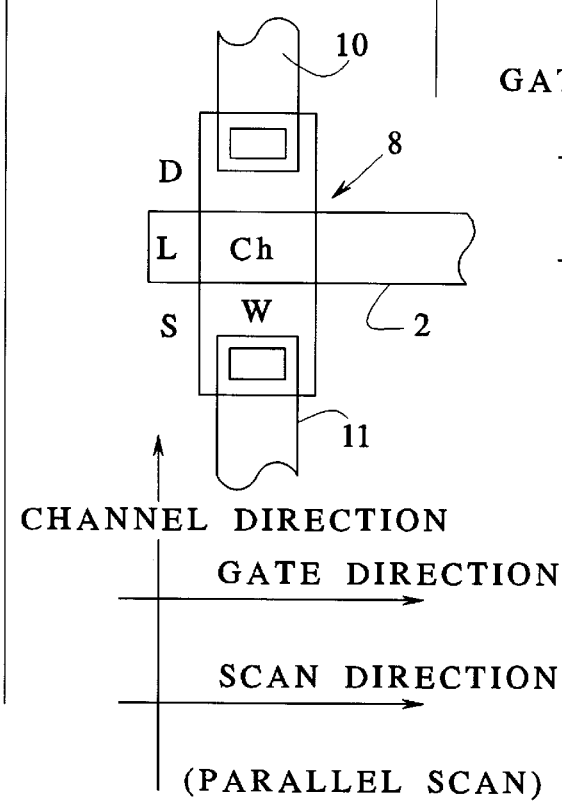

FIGS. 2A through 2C diagrammatically show the orthogonal scan method and the parallel scan method. As shown in FIG. 2A, the energy beam has a linearly shaped irradiation area 5a. The energy beam moves along the scan direction which is orthogonal to the linear area 5a while partly overlapping each other. The overlapped portion 5b is indicated by hatching it. The scan direction of the energy beam is orthogonal to the gate direction in the orthogonal scan as shown in FIG. 2B. Accordingly, the scan direction is parallel with the channel direction. It is noted that L in the figure denotes a longitudinal size of the channel region Ch and W a width size thereof. Contrary to that, the scan direction of the energy beam is parallel with the gate direction in the parallel scan as shown in FIG. 2C. In other words, the scan direction is orthogonal to the channel direction.

Figure 3:
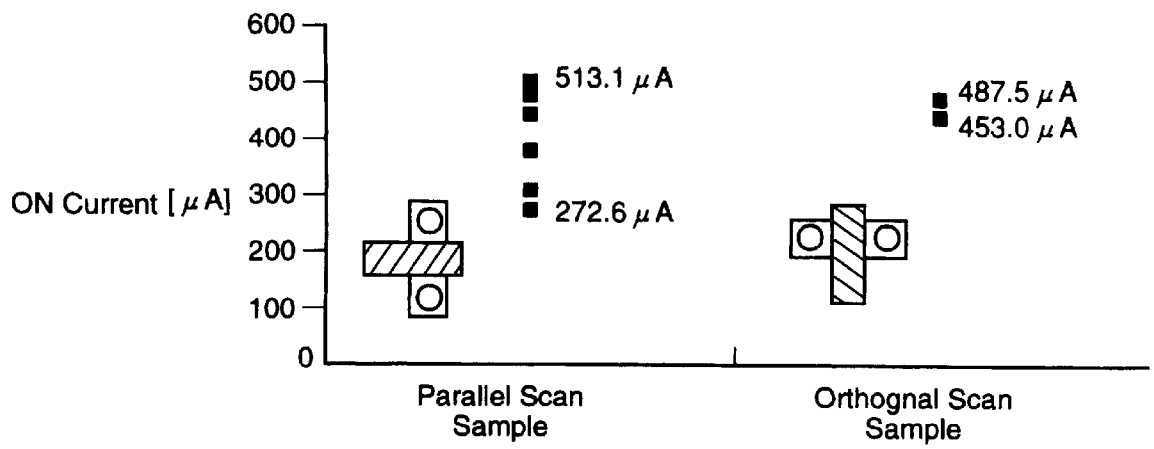
FIG. 3 is a graph in which ON currents of parallel scan samples and orthogonal scan samples are compared.

Samples of the thin film transistors were prepared by the orthogonal scan method and the parallel scan method and their electrical characteristics were evaluated. FIG. 3 is a graph showing a distribution of ON currents measured in the samples of the parallel scan and those of the orthogonal scan, respectively. It is noted that these samples are those of N-channel type and bottom gate structure thin film transistors which are formed in a peripheral driving circuit section of the thin film semiconductor device used in the active matrix type display unit. Their channel size is set at W/L=20 µm/7 µm. The ON currents were measured for the samples of such thin film transistors under the condition of a gate voltage VGS=15 V and a drain voltage VDS=15 V. As it is apparent from the graph in FIG. 3, dispersion of the ON currents of the orthogonal scan samples is smaller than that of the parallel scan samples. Accordingly, it has been clarified that the dispersion of the electrical characteristic of the thin film transistor may be suppressed by crystallizing the semiconductor thin film by the orthogonal scan method. Further, values of the ON currents themselves of the orthogonal scan samples are greater than those of the parallel scan samples. It has been also found that such effect is remarkable in the N-channel type thin film transistors rather than in P-channel type thin film transistors.

Figure 4:
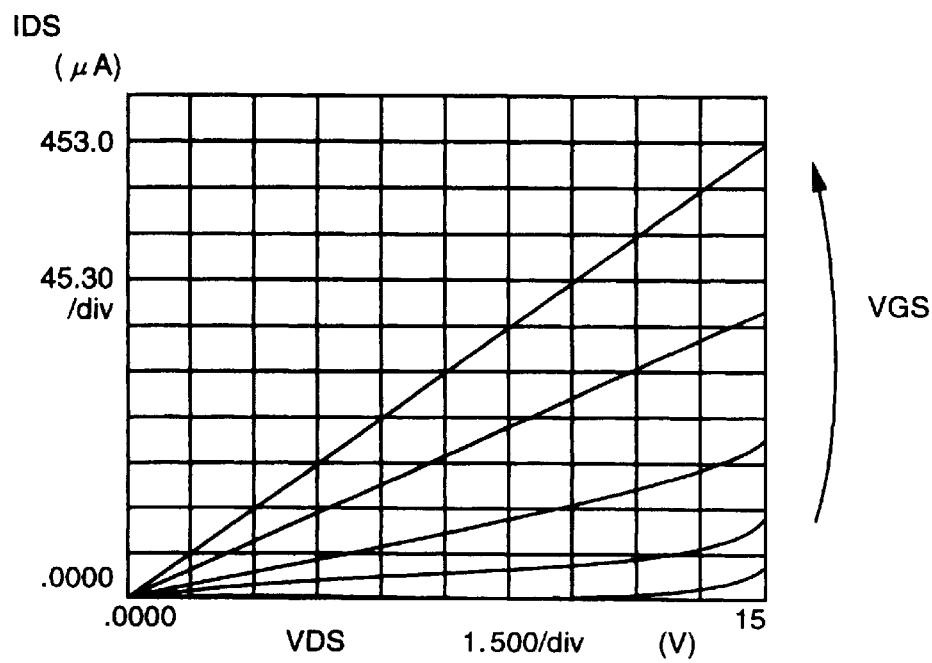
FIG. 4 is a graph showing a drain voltage/drain current characteristic of the orthogonal scan sample.

FIG. 4 shows a measured result of a relationship between the drain voltage VDS and the drain current IDS of the orthogonal scan samples shown in FIG. 3. It is noted that a gate voltage VGS is used as a parameter in this graph. As it is apparent from the graph, the drain current IDS rises favorably along the rise of the drain voltage VDS.

Figure 5:
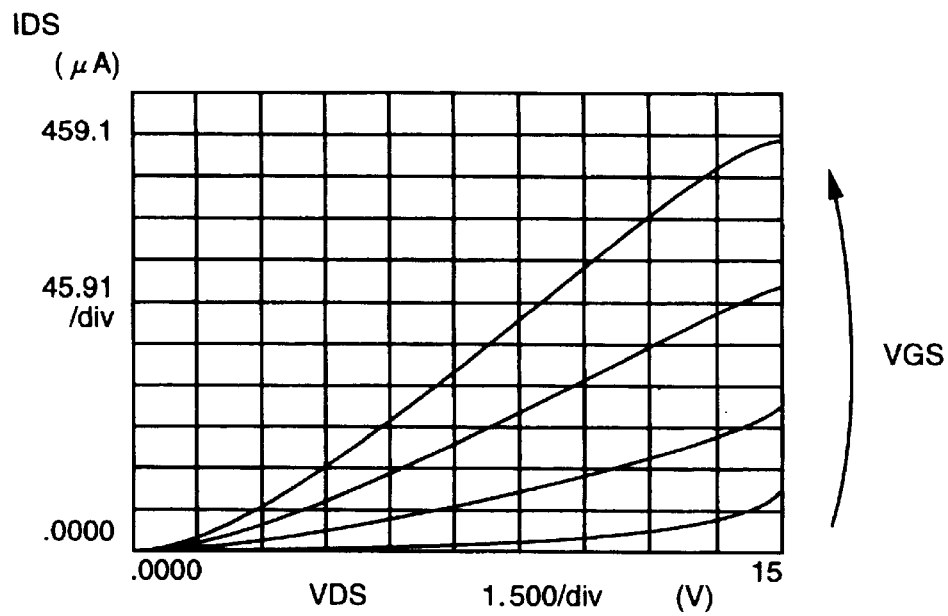
FIG. 5 is a graph showing a drain voltage/drain current characteristic of the parallel scan sample.

Meanwhile, FIG. 5 is a graph showing a measured result of the VDS/IDS characteristic of the parallel scan samples shown in FIG. 3. It can be seen from this measured result that the IDS is remarkably deficient in the region where the VDS is specifically low and enough ON current cannot be obtained. Accordingly, an enough driving power for the thin film transistor cannot be obtained in the region where the VDS is low when the parallel scan method is adopted.

Figure 6:
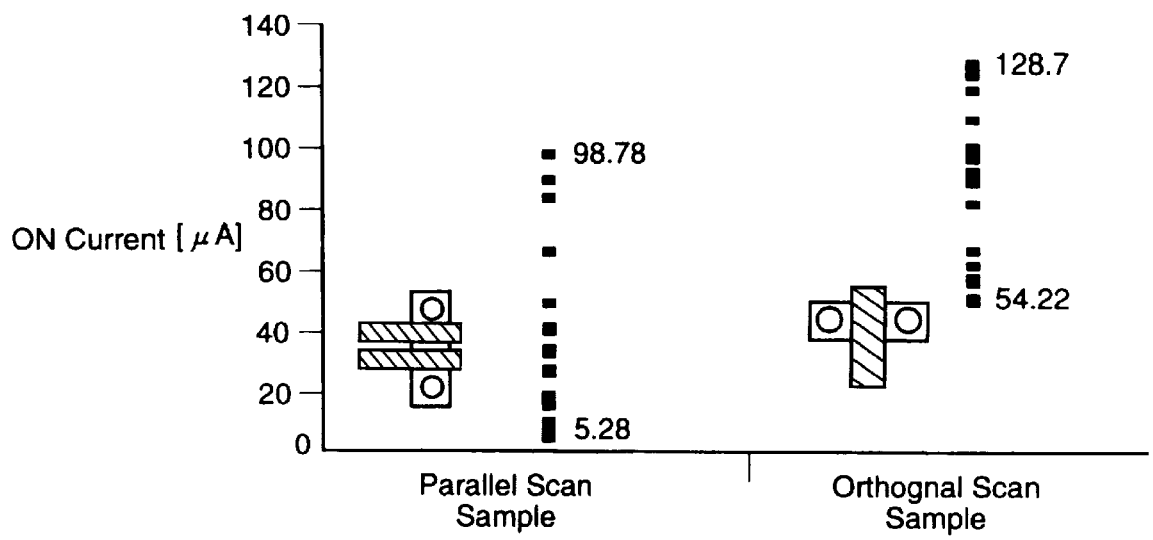
FIG. 6 is a graph in which ON currents of parallel scan samples and orthogonal scan samples are compared.

FIG. 6 is a graph showing a result of ON currents measured by preparing orthogonal scan samples and parallel scan samples with respect to the thin film transistor used for switching and driving the pixel electrode. This thin film transistor is an N-channel type transistor having the bottom gate structure. It also has a double-gate structure and the size of each channel is set at W/L=10 µm/5 µm. When the ON currents are measured under the condition of VGS=14 V and VDS=10 V, dispersion of them of the orthogonal scan samples is smaller than that of the parallel scan samples and the current value itself of the orthogonal scan samples is also greater than that of the parallel scan samples.

Figure 7:
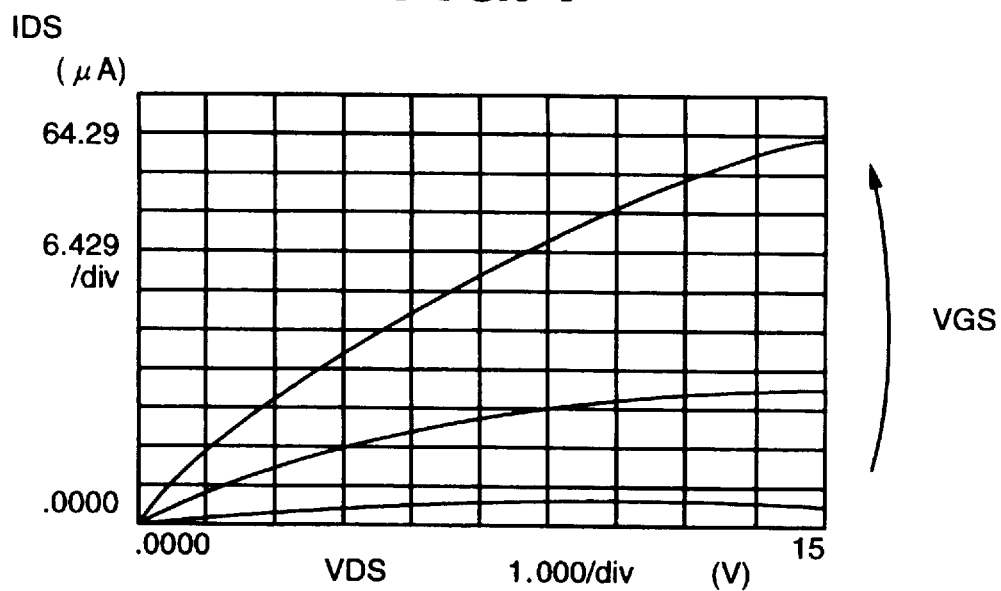
FIG. 7 is a graph showing a drain voltage/drain current characteristic of the orthogonal scan sample.

FIG. 7 is a graph showing a measured result of the VDS/IDS characteristic of the orthogonal scan samples shown in FIG. 6. The IDS favorably increases along the rise of the VDS. Specifically, an enough IDS flows even in the region where the VDS is low.

Figure 8:
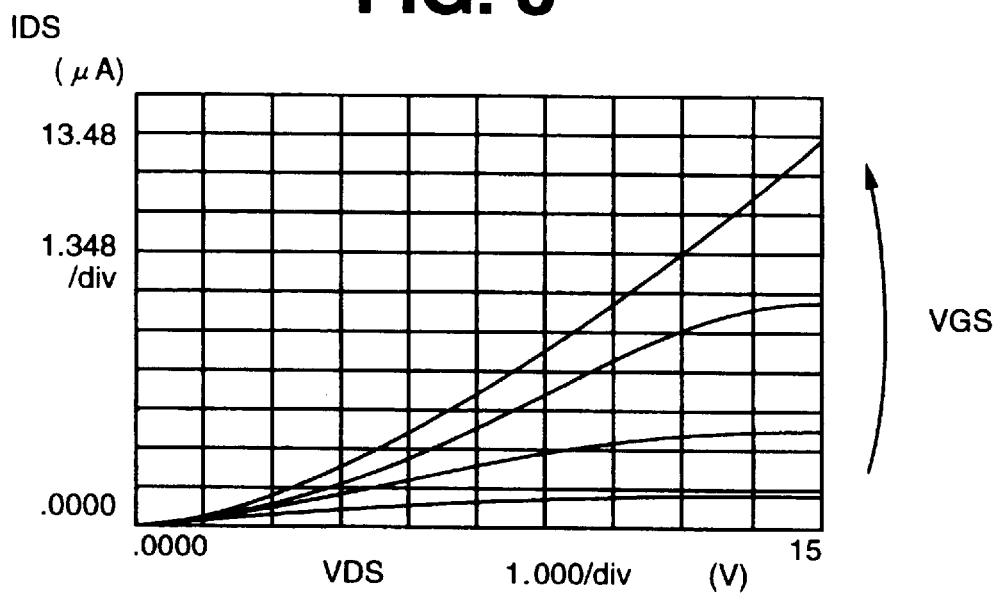
FIG. 8 is a graph showing a drain voltage/drain current characteristic of the parallel scan sample.

Meanwhile, FIG. 8 is a graph showing a measured result of the VDS/IDS characteristic of the parallel scan samples shown in FIG. 6. The IDS is remarkably deficient in the region where the VDS is low. When such a thin film transistor is used as a switching element, it becomes difficult to write an enough signal potential to the pixel electrode in the region where the VDS is low, thus causing a defect of luminescent spot in case of a normally white mode display unit for example.

As described above, according to the present embodiment, the energy beam having the linear irradiation area is moved in the scan direction which is parallel to the channel region and is orthogonal to the gate electrode in crystallizing the semiconductor thin film while relatively moving the energy beam along the scan direction orthogonal to the irradiation area. By adopting this orthogonal scan method, the carrier mobility, i.e. the transistor characteristic, may be enhanced and the dispersion may be suppressed as compared to the parallel scan method, thus leading to the improvement of the throughput and of the image quality. Further, it allows the degradation of the transistor characteristics to be suppressed, thus improving the reliability.

Another preferred embodiment of the present invention will be explained below in detail with reference to the drawings. FIGS. 9A through 9D are flow diagrams showing the embodiment of the method for fabricating a thin film semiconductor device according to the present invention. As shown in FIG. 9A, a film forming step for forming a basic structure of a thin film transistor on a transparent substrate 91 is carried out at first. A low fusion point and low cost glass (e.g. NA-35 produced by HOYA Corporation) is used for the transparent substrate 91. The thin film transistor comprises, basically, an amorphous semiconductor thin film 93 and a metallic gate electrode 94 which are laminated on the opposite side from each other on a interposing gate insulating film 92 extending therebetween. In the present embodiment, the basic structure of the bottom gate type thin film transistor is formed by laminating, in order from the bottom, the gate electrode 94, the gate insulating film 92 and the semiconductor thin film 93 on the surface of the transparent substrate 91. In concrete, Mo or Cr is formed at first on the transparent substrate 91 by sputtering and is patterned into a predetermined shape to form the gate electrode 94. It is noted that the material of the gate electrode 94 is not limit to metals, and silicide and polycide may be used for that. Silicide is an eutectic crystal alloy of metal and silicon and polycide has a laminated structure in which silicide is formed on the surface of polycrystalline silicon. What is important is that the gate electrode 94 is metallic and is capable of effectively absorbing heat rays. It is noted that a thickness of the gate electrode 94 is about 200 nm for example. Next, $SiO_2$ is deposited into a thickness of 80 nm for example by CVD to form the gate insulating film 92. Further, amorphous silicon is deposited into a thickness of 40 nm by LPCVD to form the semiconductor thin film 93.

Next, a heating step is carried out as shown in FIG. 9B. Heat rays 95 are applied from the side of the gate electrode 94 to cause the metallic gate electrode 94 to absorb them and to heat in auxiliary a part of the region of the semiconductor thin film 93 which faces the gate electrode 94 via the gate insulating film 92. In concrete, the heat rays 95 are applied from the back of the transparent substrate 91, i.e. from the side of the gate electrode 94. The heating step is carried out by using a halogen lamp for example which radiates a large amount of infrared rays which are one type of heat rays and an output of the lamp is controlled so that the temperature of the semiconductor thin film 93 reaches to about 400° C. Then, the metallic gate electrode 94 is heated and the temperature of the part of the region of the semiconductor thin film 93 rises indirectly by thermal conduction quickly to about 400° C. The thickness of the gate insulating film 92 is desired to be less than 700 nm from the aspect of a coefficient of thermal conductivity.

A crystallization step (crystallization annealing) is carried out in the same time with this heating step. That is, energy beams 96 are applied from the side of the semiconductor thin film 93, i.e. from the opposite side from the gate electrode 94, to transform the semiconductor thin film 93 in the region heated in auxiliary from the amorphous substance into a polycrystalline substance to form an active layer 930 of the thin film transistor. That is, the energy beams 96 are applied from the surface of the transparent substrate 91, i.e. from the side of the semiconductor thin film 93, in this crystallization step. The active layer 930 thus obtained almost matches plane-wise with the gate electrode 94 and becomes a channel region of the bottom gate type thin film transistor. The transformation from the amorphous substance to the polycrystalline substance is not fully carried out in the part other than this channel region because the semiconductor thin film 93 is not sufficiently heated in auxiliary. An excimer laser beam for example may be used as the energy beam 96. The amorphous silicon may be transformed into the polycrystalline silicon by applying the excimer laser beam having a planar section in batch by one shot. In this case, the planar excimer laser beam uniformly shaped with energy density of 250 mJ/cm$^2$ for example is applied. It is also possible, depending on a case, to apply linear excimer laser beams by way of multi-scan shot while overlapping them partially. For example, XeCl excimer laser beams linearly shaped having a wavelength of 308 nm for example may be repeatedly applied pulse-wise at high speed. The laser beam is shaped into a linear shape of 300 mm×0.5 mm for example and the irradiation energy density is set at 350 mJ/cm$^2$. The laser beam has a pulse width of about 40 nsec. For example and is applied pulse-wise with a repetitive frequency of about 150 Hz. At this time, the linear laser beams are applied pulse-wise while being overlapped by about 20%. Meanwhile, the output of the halogen lamp is set so that a peak temperature of the semiconductor thin film becomes about 400° C.

Following to that, an impurity injecting step is carried out as shown in FIG. 9C. A source region S and a drain region D of a thin film transistor 98 are formed by injecting impurities 97 to part of the semiconductor thin film 93 which adjoins the active layer 930. In concrete, a mask 99 which matches with the gate electrode 94 is formed on the semiconductor thin film 93 and the impurities 97 are injected by means of ion shower doping via the mask. The mask 99 may be patterned by self-alignment by exposing from the back via the gate electrode 94 for example. Thereby, the active layer 930 which has been poly-crystallized by the crystallization annealing is coated almost by the mask 99. Because no impurity 97 is injected right under the mask 99, the layer 930 becomes a channel region Ch of the thin film transistor 98. On the other hand, ions of the impurities 97 are injected by means of the electric field acceleration to the part of the semiconductor thin film 93 which has been kept amorphous, thus forming the source region S and the drain region D. Because these regions take the ion shower doping, they need not be crystallized from the beginning. Even if they are crystallized, the crystallization is not necessarily preserved when the ion shower doping is performed.

Finally, the bottom gate type thin film transistor 98 is coated by an interlayer insulating film 910 as shown in FIG. 9D. This interlayer insulating film 910 may be obtained by depositing PSG by CVD. After perforating contact holes through the interlayer insulating film 910 by etching, an aluminum film or the like is formed by sputtering and is patterned into a predetermined shape to form a signal electrode 911. The signal electrode 911 is electrically connected with the source region S of the thin film transistor 98 via the contact hole. Further, a transparent conductive film made from ITO or the like is formed by sputtering and is patterned to form a pixel electrode 912. This pixel electrode 912 is also electrically connected with the drain region D of the thin film transistor 98 via the contact hole. The thin film semiconductor device having such structure is suited for the driving substrate of the active matrix type display panel.

While the bottom gate type thin film transistor 98 is fabricated in the present embodiment, the gate electrode 94 may be easily metalized and a light shield for the channel region may be automatically made in the bottom gate structure. After depositing the semiconductor thin film such as the amorphous silicon, the excimer laser beam is applied to transform the amorphous silicon into the polycrystalline silicon a way of forming the bottom gate type thin film transistor 98 on the transparent substrate 91. At this time, a controlled amount of light of the lamp is applied from the back of the transparent substrate 91 as the auxiliary heating when the laser is applied so that the temperature of the amorphous silicon rises to about 400° C. The transparent substrate may be heated readily by applying the light of the lamp together with the irradiation with laser beam and the processing time which used to take several minutes in the past may be reduced to the order of second. Thereby, the productivity is improved remarkably. Further, the crystal grain size of the polycrystalline silicon may be increased, favorable operating characteristics may be obtained even in the bottom gate type thin film transistor which has been difficult to fabricate in terms of performance and the definition of a liquid crystal display panel may be enhanced.

FIGS. 10A through 10D show a still other preferred embodiment of a method for fabricating a thin film semiconductor device according to the present invention, wherein a thin film transistor having a top gate structure, instead of the bottom gate structure, is integrally formed. Generally, as compared to the bottom gate structure in which the gate electrode is located below, the top gate structure in which the gate electrode is located above may be fabricated more readily and a higher performance transistor characteristic may be obtained. At first, a film forming step is carried out as shown in FIG. 10A. That is, a basic structure of the top gate type thin film transistor is formed by laminating, in order from the bottom, an amorphous semiconductor thin film 103, a gate insulating film 102 and a metallic gate electrode 104 on the surface of a transparent substrate 101. Next, a heating step is carried out by applying heat rays 105 from the surface of the transparent substrate 101, i.e. from the side of the gate electrode 104, as shown in FIG. 10B. Thereby, the heat rays 105 are absorbed by the metallic gate electrode 104 and a region of the semiconductor thin film 103 facing to the gate electrode 104 is intensively and locally auxiliary heated via the gate insulating film 102. A crystallization step is carried out in the same with this heating step by applying energy beams 106 from the back of the transparent substrate 101, i.e. from the side of the semiconductor thin film 103. Thereby, the semiconductor thin film 103 at the region heated in auxiliary is transformed from the amorphous substance to a polycrystalline substance to form an active layer 130 of the thin film transistor. Next, impurities 107 are injected into part of the semiconductor thin film 103 adjoining the active layer 130 by self-alignment by using the gate electrode 104 as a mask by ion doping as shown in FIG. 10C. Finally, the gate insulating film 102 is cut adjusting to the gate electrode 104 and the semiconductor thin film 103 is cut adjusting to an element region of each individual thin film transistor 108 as shown in FIG. 10D. After that, the thin film transistor 108 is coated by an interlayer insulating film 110 and contact holes which communicate with a source region S and a drain region D are perforated. A signal electrode 111 and a pixel electrode 112 are formed by patterning on the interlayer insulating film 110.

Figure 11:
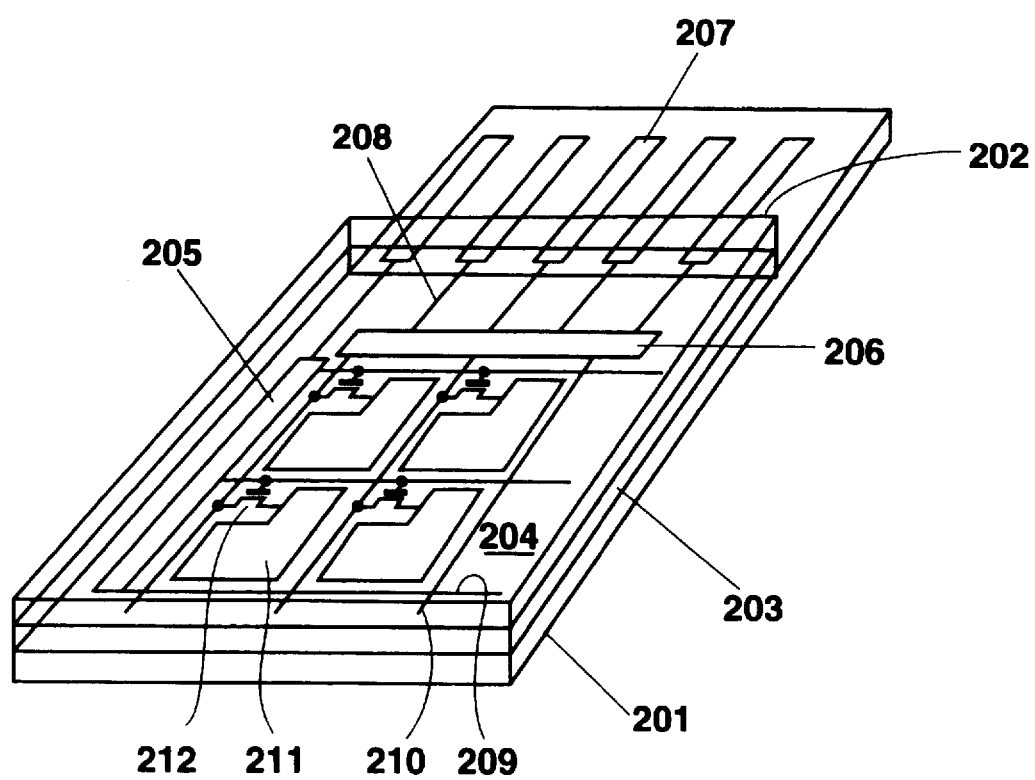
FIG. 11 is a perspective view showing one example of an active matrix display panel in which a thin film semiconductor device fabricated in accordance to the present invention is built in as a driving substrate.

Finally, one example of the active matrix type display panel in which the thin film semiconductor device fabricated in accordance to the present invention is used as the driving substrate will be explained briefly with reference to FIG. 11. The display panel comprises a driving substrate 201, an opposed substrate 202 and electro-optic substance 203 held between them. Liquid crystal material or the like is used widely as the electro-optic substance 203. A glass substrate whose area may be largely expanded and whose cost is relatively low may be used for the driving substrate 201. A pixel array section 204 and a driving circuit section are integrally formed on the driving substrate 201 and a monolithic structure may be adopted. That is, a peripheral driving circuit section may be built in a body in addition to the pixel array section. The driving circuit section is divided into a vertical driving circuit 205 and a horizontal driving circuit 206. Further, a terminal section 207 for connecting with an outside circuit is formed at the upper end of the peripheral portion of the driving substrate 201. The terminal section 207 is connected with the vertical driving circuit 205 and the horizontal driving circuit 206 via a wire 208. Meanwhile, an opposed electrode (not shown) is formed on the whole inner surface of the opposed substrate 202. Gate wires 209 in row and signal wires 210 in column are formed in the pixel array section 204. The gate wire 209 is connected to the vertical driving circuit 205 and the signal wire 210 is connected to the horizontal driving circuit 206. A pixel electrode 211 and a thin film transistor 212 for driving it are integrally formed at the intersection of the both wires. The thin film transistors are also integrally formed in the vertical driving circuit 205 and the horizontal driving circuit 206.

As described above, according to the present embodiment, the thin film transistor is heated in auxiliary by a halogen lamp or the like from the back of the transparent substrate such as a glass during the steps for fabricating the bottom gate structure made by using a metallic material for example and then the excimer laser beam is applied to the semiconductor thin film from the front side of the transparent substrate. Thereby, the semiconductor thin film having an excellent crystallinity and a large grain size may be obtained with a good throughput, thus enhancing the performance of the thin film transistor. Although it took about three minutes of processing time in a batch and large area laser annealing in the past, it takes only several tens of seconds, thus remarkably improving the productivity. Further, the improvement of the crystallinity enhances the carrier mobility of the thin film transistor, allows fully large ON currents to be maintained and sharpens the swing characteristic (inversion characteristic). Thereby, the thin film transistor may be micronized further and when it is applied to the active matrix type liquid crystal display panel and the like, its definition may be increased further.

While preferred embodiments have been described, variations thereto will occur to those skilled in the art within the scope of the present inventive concepts which are delineated by the following claims.

What is claimed is:

1. A method for fabricating a thin film semiconductor device, comprising the steps of:

forming a thin film transistor composed of an amorphous semiconductor thin film and a metallic gate electrode laminated on the opposite side from each other via a gate insulating film on a transparent substrate;

applying heat rays from the side of said gate electrode to heat said gate electrode which auxiliary heats a region of said amorphous semiconductor thin film which is opposed to said gate electrode;

applying energy beams from the side of said amorphous semiconductor thin film on the opposite side from said gate electrode to transform said amorphous semiconductor thin film in the region auxiliary heated by the gate electrode into a polycrystalline semiconductor thin film to form an active layer of said thin film transistor; and then introducing impurities into parts of said semiconductor thin film adjoining said active layer to form a source region and a drain region of said thin film transistor.

2. The method for fabricating the thin film semiconductor device according to claim 1, wherein said thin film transistor having a bottom gate structure is formed by laminating, in order from the bottom, said gate electrode, said gate insulating film and said amorphous semiconductor thin film on the surface of said transparent substrate in said film forming step; the heat rays are applied from the back of said transparent substrate which is the side of said gate electrode, in said heating step; and the energy beams are applied from the surface of said transparent substrate which is the side of said amorphous semiconductor thin film, in said crystallization step.

3. The method for fabricating the thin film semiconductor device according to claim 1, wherein said thin film transistor having a top gate structure is formed by laminating, in order from the bottom, said amorphous semiconductor thin film, said gate insulating film and said gate electrode on the surface of said transparent substrate in said film forming step; the heat rays are applied from the surface of said transparent substrate which is the side of said gate electrode, in said heating step; and the energy beams are applied from the back of said transparent substrate which is the side of said amorphous semiconductor thin film, in said crystallization step.

4. The method for fabricating the thin film semiconductor device according to claim 1, wherein said gate insulating film is formed in a thickness of less than 700 nm in said forming step.

5. The method for fabricating the thin film semiconductor device according to claim 1, wherein impurity ions are accelerated by means of an electric field to be implant into parts of said amorphous semiconductor thin film in said impurity injecting step.

6. The method for fabricating the thin film semiconductor device according to claim 1, further comprising coating said thin film transistor with an interlayer insulation film and performing a wiring step for patterning a signal electrode which is connected with said source region and a pixel electrode which is connected with said drain region on said interlayer insulating film.

7. A method for fabricating a thin film semiconductor device, said method comprising the steps of providing a transparent substrate, forming on said substrate a thin film transistor composed of an amorphous semiconductor thin film and a metallic gate electrode laminated on opposite sides of a gate insulating film, crystallizing a portion of the amorphous semiconductor material into a polycrystalline semiconductor thin film while maintaining adjacent portions of the semiconductor thin film amorphous by applying heat rays from a side of said gate electrode to heat the gate electrode, which auxiliary heats a region of the amorphous semiconductor thin film which is opposed to said gate electrode and applying energy beams from the side of the amorphous semiconductor thin film on the opposite side from the gate electrode to transform said amorphous semiconductor thin film in said region into a polycrystalline semiconductor thin film; and then introducing impurities to the parts of the amorphous semiconductor film adjoining an active layer to form source regions and a drain region for said film transistor.

8. A method according to claim 7, wherein the applying of heat rays to heat the gate electrode heats the region of the amorphous semiconductor thin film to a temperature less than required for recrystallization.

9. A method according to claim 7, wherein said step of forming a thin film transistor forms a thin film transistor having a bottom gate structure with the gate electrode being deposited on said substrate and the step of applying heat rays applies the heat rays through the transparent substrate to heat the gate electrode.

10. A method according to claim 7, wherein the thin film transistor is a top gate structure with the amorphous semiconductor thin film being deposited on the transparent substrate and the energy beams are applied through said transparent substrate.

* * * * *